United States Patent [19]
Yamasaka

[11] Patent Number: 6,130,104
[45] Date of Patent: Oct. 10, 2000

[54] CLEANER FOR INSPECTING PROJECTIONS, AND INSPECTION APPARATUS AND METHOD FOR INTEGRATED CIRCUITS

[75] Inventor: Rikihito Yamasaka, Yamanashi-ken, Japan

[73] Assignee: Tokyo Electron Limited, Tokyo, Japan

[21] Appl. No.: 09/055,291

[22] Filed: Apr. 6, 1998

[30] Foreign Application Priority Data

Apr. 8, 1997 [JP] Japan .................................. 9-106615
Apr. 8, 1997 [JP] Japan .................................. 9-106616

[51] Int. Cl.[7] .................................................. G01R 31/26
[52] U.S. Cl. ............................ 438/14; 134/6; 451/533; 324/754
[58] Field of Search .......................... 438/14, 15; 134/6, 134/7, 9; 451/59, 533; 324/754

[56] References Cited

U.S. PATENT DOCUMENTS 5,174,765  12/1992  Williams et al. ........................ 439/86
5,220,279   6/1993  Nagasawa .
5,778,485   7/1998  Sano et al. ............................. 15/301
5,968,282  10/1999  Yamasaka ............................. 134/6
6,056,627   5/2000  Mizuta ................................. 451/59

FOREIGN PATENT DOCUMENTS 4-364746  12/1992  Japan .

*Primary Examiner*—John F. Niebling
*Assistant Examiner*—John Murphy
*Attorney, Agent, or Firm*—Oblon, Spivak, McClelland, Maier & Neustadt, P.C.

[57] ABSTRACT

A cleaner of this invention is a cleaner for inspecting projections and removes any substance, e.g., aluminum oxide, which attaches to needle points of probe needles, when the probe needles pierce into the cleaner. The cleaner has a cleaner layer and a substrate. The cleaner layer is constituted by an elastic material layer, and a filler having a surface state improving function of the inspecting projections and dispersed in the elastic material layer. As the filler having a surface state improving function, a powder including at least one of ceramic materials, e.g., sand, glass, alumina, Carborundum (trade name), and the like, or a fiber layer made of an inorganic fiber or organic fiber can be employed.

20 Claims, 4 Drawing Sheets

CLEANER FOR INSPECTING PROJECTIONS, AND INSPECTION APPARATUS AND METHOD FOR INTEGRATED CIRCUITS

BACKGROUND OF THE INVENTION

The present invention relates to a cleaner for inspecting projections, and an inspection apparatus and method for integrated circuits having this cleaner.

More particularly, the cleaner according to the present invention is a cleaner for inspecting projections (e.g., wire conductors such as probe needle or projecting conductors such as bump terminals) used for inspecting the electrical characteristics of integrated circuits and various types of mounted electronic components formed on a semiconductor wafer. The inspection apparatus and method for the integrated circuits according to the present invention are an inspecting apparatus and method having this cleaner, which inspect the electrical characteristics of integrated circuits formed on a semiconductor wafer.

A prober is used as an inspection apparatus for inspecting the electrical characteristics of mounted electronic components, e.g., integrated circuits formed on a semiconductor wafer (to be referred to as a "wafer" hereinafter). This prober is used when inspecting a plurality of IC chips formed on, e.g., a wafer one by one or in a batch. FIG. 3 shows an example of the prober. This prober 10 has a loader unit 11 for conveying wafers W stored in a cassette C, a prober unit 12 for inspecting the wafers W conveyed by a convey mechanism (not shown) disposed in the loader unit 11, a controller 13 for controlling the prober unit 12 and loader unit 11, and a display 14 also serving as a control panel used for operating the controller 13.

A sub chuck (not shown) is disposed in the loader unit 11. The sub chuck prealigns each wafer W with reference to its orientation flat. The wafer W is conveyed to the prober unit 12 by the convey mechanism.

A main chuck 15 for placing the wafer W thereon is arranged in the prober unit 12. The main chuck 15 is movable in the X, Y, Z, and θ directions. An alignment mechanism 16 and a probe card 17 are also disposed in the prober unit 12. The alignment mechanism 16 has an alignment bridge 16A and the like for precisely aligning the wafer W, placed on the main chuck 15, with the inspecting position. The probe card 17 has inspecting projections (probe needles) 17A for electrically inspecting the wafer W. The probe card 17 is fixed to the opening portion at the center of a head plate 18 through an insert ring 18A. The head plate 18 can open and close with respect to the top surface of the prober unit 12. A test head 19 is swingably disposed on the prober unit 12. While the test head 19 is flipped open on the prober unit 12, the probe card 17 and a tester (not shown) are electrically connected to each other through the test head 19. A predetermined signal from the tester is supplied to the wafer W on the main chuck 15 through the probe card 17. A plurality of IC chips formed on the wafer W are thus electrically inspected.

When inspecting the wafer W, a drive mechanism moves the main chuck 15 so that the wafer W on the main chuck 15 and the probe needles 17A are aligned with each other. When the main chuck 15 is over-driven upward and the probe needles 17A come into electrical contact with the electrode pads of the IC chips on the wafer W, the IC chips are inspected. The electrode pads of the IC chips are made of, e.g., aluminum. A native oxide film is formed on the surface of the electrode pad of each IC chip. This native oxide film is not preferable to ensure good electrical contact between the probe needle 17A and the electrode pad. Therefore, the probe needle 17A is moved on the electrode pad surface to scrape the native oxide film, thereby ensuring electrical contact between the probe needle 17A and the electrode pad. When inspection of the IC chips is continued, the native oxide film (aluminum oxide or the like) attaches to the probe needle 17A as an attaching substance O, as shown in FIG. 4. The attaching substance O becomes an obstacle in the following inspection.

Hence, a means for cleaning the distal end portions of the probe projections 17A is formed on the main chuck 15. An example of this means will be described with reference to FIG. 5. A mount table 15A is arranged on the side of the main chuck 15. An abrasive plate 20 is attached to the mount table 15A. When the main chuck 15 is vertically moved, the projecting ends of the probe needles 17A come into contact with the abrasive plate 20 and are abraded by it, so that the substance O attaching to them is removed.

In the conventional cleaning method, the probe needles 17A are pressed by the abrasive plate 20 and are abraded by it so that the substance O attaching to their distal ends are removed. However, the entire portions of the distal ends of the probe needles 17A are not always abraded. Sometimes the attaching substance O remains on the distal ends such that it can be easily removed. During inspection, this remaining attaching substance O separates from the distal ends of the probe needles 17A to contaminate the chips. Also, the chippings remaining on the abrasive plate 20 or the abrasive powders of the abrasive plate 20 scatter from the abrasive plate 20 to contaminate the chips. As the feature sizes of chips continue to decrease, the influence of contamination becomes prominent.

When fabricating the probe needle 17A, a burr remains on its needle point. Conventionally, this burr is removed by, e.g., wet etching. This burr removal is a complex operation.

The probe card includes a membrane type probe card. While a large number of bump terminals formed on the membrane of the probe card of this type are in contact with the electrode pads, the electrical characteristics of the chips are inspected. In this case, as inspection is repeated, aluminum oxide or the like attaches to the bump terminals. In the membrane probe card, no means for effectively abrading the bump terminals is available, and it is difficult to remove the substance attaching to the bump terminals.

A flip-chip element has a solder bump on its electrode portion. When this solder bump is fused by heating, the flip-chip element is bonded on the substrate facing down. If an impurity attaches to the solder bump, electrical connection becomes poor. Conventionally, the substance attaching to the solder bump is removed by blasting or the like. However, a measure against scattering of the blasting material during blasting is required.

BRIEF SUMMARY OF THE INVENTION

The present invention has been made in order to solve one or a plurality of the problems described above.

It is an object of the present invention to provide a cleaner for inspecting projections, and an inspection apparatus and method for integrated circuits having this cleaner.

According to the first aspect of the present invention, there is provided a cleaner for inspecting projections, comprising:

a substrate; and a cleaner layer fixed on the substrate, the cleaner layer having an elastic material layer and a material having a surface state improving function for the inspecting projections and integrated with the elastic material layer and, wherein the projections are pierced into and pulled out of the cleaner layer to improve a surface state of the projections.

According to the second aspect of the present invention, there is provided the cleaner for inspecting projections according to the first aspect, wherein a filler of the material having a surface state improving function is added to the elastic material in the cleaner layer with a weight composition (elastic material:filler) of the filler to the elastic material of 4:6 to 3:7.

According to the third aspect of the present invention, there is provided the cleaner for inspecting projections according to the first aspect, wherein a film not containing the material having the surface state improving function is formed on a surface of the cleaner layer.

According to the fourth aspect of the present invention, there is provided the cleaner for inspecting projections according to the first aspect, wherein the material having the surface state improving function is a powder.

According to the fifth aspect of the present invention, there is provided the cleaner for inspecting projections according to the first aspect, wherein the material having the surface state improving function is a fiber.

According to the sixth aspect of the present invention, there is provided the cleaner for inspecting projections according to the first aspect, wherein the material having the surface state improving function is an inorganic fiber.

According to the seventh aspect of the present invention, there is provided the cleaner for inspecting projections according to the first aspect, wherein the material having the surface state improving function is an inorganic fiber and a powder.

According to the eighth aspect of the present invention, there is provided a cleaner for inspecting projections, comprising:

a substrate; and a cleaner layer fixed on the substrate, the cleaner layer having an elastic material layer and a filler dispersed in the elastic material layer, wherein the inspecting projections are pierced into the cleaner layer to remove a substance attaching to distal ends of the projections.

According to the ninth aspect of the present invention, there is provided the cleaner for inspecting projections according to the eighth aspect, wherein the filler is added to the elastic material in the cleaner layer with a weight composition (elastic material:filler) of the filler to the elastic material of 4:6 to 3:7.

According to the tenth aspect of the present invention, there is provided a cleaner for inspecting projections, comprising:

a substrate; and a cleaner layer fixed on the substrate, the cleaner layer having an elastic material layer and a mesh-like inorganic fiber layer integrally stacked on the elastic material layer, wherein the inspecting projections are pierced into the cleaner layer to remove a substance attaching to distal ends of the projections.

According to the eleventh aspect of the present invention, there is provided the inspection apparatus which has inspecting projections that are brought into contact with electrodes of at least one integrated circuit formed on a semiconductor wafer, and which inspects electrical characteristics of the integrated circuit, the inspection apparatus comprising a cleaner for cleaning the projections, the cleaner comprising:

a substrate; and a cleaner layer fixed on the substrate, the cleaner layer having an elastic material layer and a material having a surface state improving function for the inspecting projections and integrated with the elastic material layer, and wherein the inspecting projections are pierced into the cleaner layer to improve a surface state of the inspecting projections.

According to the twelfth aspect of the present invention, there is provided the inspection apparatus for inspecting projections according to the eleventh aspect, wherein a filler of the material having the surface state improving function is added to the elastic material in the cleaner layer with a weight composition (elastic material:filler) of the filler to the elastic material of 4:6 to 3:7.

According to the thirteenth aspect of the present invention, there is provided the inspection apparatus according to the eleventh aspect, wherein a film not containing the material having a surface state improving function is formed on a surface of the cleaner layer of the cleaner.

According to the fourteenth aspect of the present invention, there is provided the inspection apparatus according to eleventh aspect, wherein the material in the cleaner which has the surface state improving function for the inspecting projections is a powder.

According to the fifteenth aspect of the invention, there is provided the inspection apparatus according to the eleventh aspect, wherein the material in the cleaner which has the surface state improving function is a fibrous material.

According to the sixteenth aspect of the present invention, there is provided the inspection apparatus according to the eleventh aspect, wherein the material in the cleaner which has the surface state improving function is an inorganic fiber.

According to the seventeenth aspect of the present invention, there is provided the inspection apparatus according to the eleventh aspect, wherein the material in the cleaner which has the surface state improving function is an inorganic fiber and a powder.

According to the eighteenth aspect of the present invention, there is provided an inspection apparatus which has inspecting projections that are brought into contact with electrodes of at least one integrated circuit formed on a semiconductor wafer, and which inspects electrical characteristics of the integrated circuit, the inspection apparatus comprising a cleaner for cleaning the inspecting projections, the cleaner comprising:

a substrate; and a cleaner layer fixed on the substrate, the cleaner layer having an elastic material layer and a surface state improving filler of a material having a surface state improving function for the inspecting projections dispersed in the elastic material layer, and the cleaner serving to clean the inspecting projections, wherein the inspecting projections are pierced into the cleaner layer to remove a substance attaching to projecting ends of the projections.

According to the nineteenth aspect of the present invention, there is provided an inspection apparatus which has inspecting projections that are brought into contact with electrodes of at least one integrated circuit formed on a semiconductor wafer, and which inspects electrical characteristics of the integrated circuit, the inspection apparatus comprising a cleaner for cleaning the inspecting projections, the cleaner comprising:

a substrate; and a cleaner layer fixed on the substrate, the cleaner layer having an elastic material layer and a mesh-like inorganic fiber layer integrally stacked on the elastic material layer, and the cleaner serving to clean the inspecting projections, wherein the projections are pierced into the cleaner layer to remove a substance attaching to projecting points of the projections.

According to the twentieth aspect of the present invention, there is provided a method of inspecting electrical characteristics of integrated circuits formed on a semiconductor wafer, comprising the steps of bringing inspecting projections into contact with electrodes of the integrated circuits, and measuring the electrical characteristics of the integrated circuits, the method further comprising the step of cleaning the inspecting projections with a cleaner, the cleaner comprising:

a substrate; and a cleaner layer fixed on the substrate, the cleaner layer having an elastic material layer and a material integrated with the elastic material layer and having a surface state improving function for the inspecting projections, and the cleaner serving to clean the inspecting projections, wherein the projections are pierced into and pulled out of the cleaner layer to improve a surface state of the projections.

In the present invention, the "substrate" can have any structure as far as it can support the cleaner layer. For example, a structure in which the substrate is integrated with the main chuck or a structure in which the substrate is placed on a predetermined portion of the main chuck to be freely removed from the main chuck can be employed. The latter structure is particularly preferable.

In the present invention, the "elastic material" can be any material as far as it has predetermined elasticity. For example, as the elastic material, inorganic rubber, e.g., silicone rubber, or organic rubber can be employed. Inorganic rubber, e.g., silicone rubber, is particularly preferable.

In the present invention, the structure "integrated with the elastic material layer" can be any structure as far as it is integrated with the elastic material layer. For example, this structure can be realized by a state wherein the material is dispersed in the entire portion of the elastic material layer, a state wherein the material is dispersed in part of the elastic material layer, a state wherein the material is fixed to the surface of the elastic material layer, or a state wherein the material is sandwiched at an intermediate portion of the elastic material layer.

In the present invention, the "surface state improving function" means a function of improving the surface state of the inspecting projections to a predetermined state. For example, this function can include at least one of removal (abrasion) of the attaching substance by scraping, removal of the attaching substance by polishing, burr removal, and surface roughening. This function particularly preferably includes at least the abrasive function.

In the present invention, as the "material having the surface state improving function", any material can be employed as far as it provides the surface state improving function. For example, as this material, a powder of at least one of ceramic materials, e.g., sand, glass, alumina, Carborundum (trade name), and the like, at least one of an inorganic fiber such as a glass fiber, an organic fiber, or a carbon fiber can be employed. When such a fiber is employed, a structure obtained by plainly weaving a long fiber is preferable.

In the present invention, the "inspecting projections" can be any means as far as it can be brought into electrical contact with a measurement target. In particular, a wire conductor such as a probe needle, or projecting conductor such as a POGO pin or bump terminal can be selected as the target.

In the present invention, the "film not containing a material having a surface state improving function" can be any film as far as it does not contain this material. In particular, a so-called skin film made of an elastic material or an elastic material film further formed on the surface of the elastic material layer is preferable.

In the present invention, "integrally stacked on the elastic material layer" refers to either one of a state wherein the mesh-like inorganic fiber layer is stacked on the surface of the elastic material layer and a state wherein the mesh-like inorganic fiber layer is stacked in the elastic material layer. This stacked layer can be one layer or a multiple of layers.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
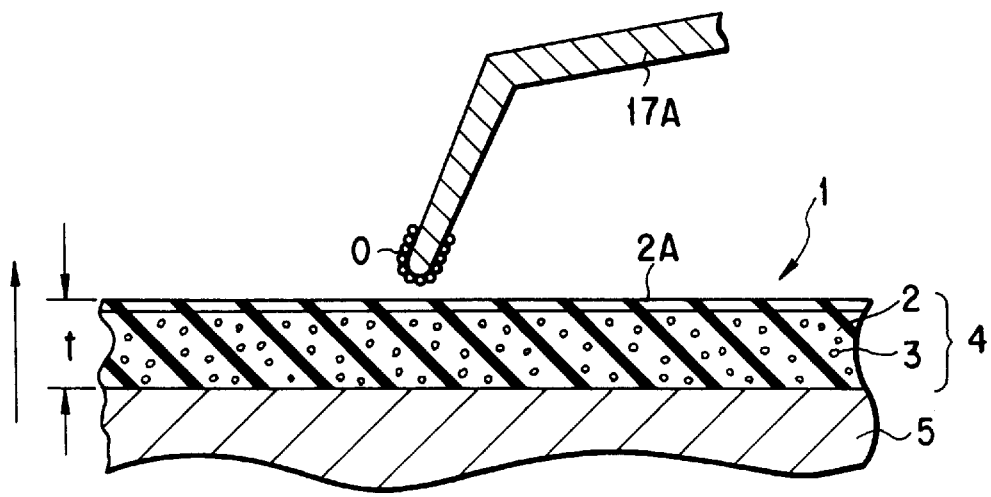
FIG. 1A is a sectional view showing a state immediately before a probe needle having a substance attaching to it is pierced into the cleaner.
Figure 1B:
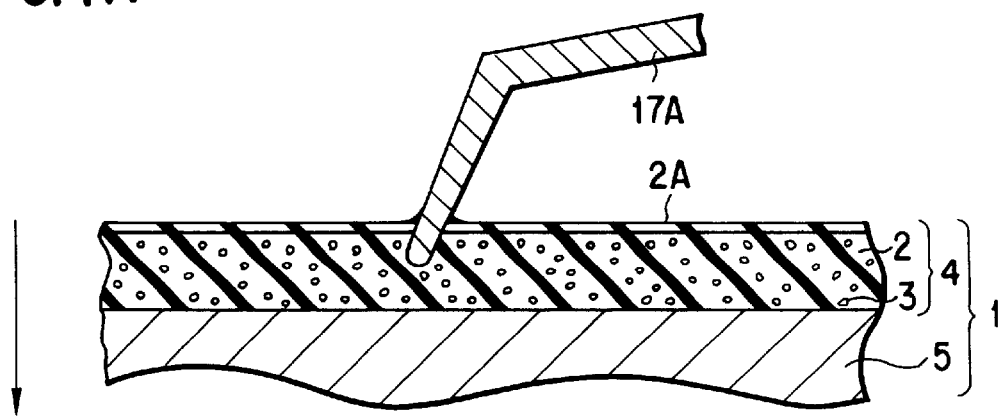
FIG. 1B is a sectional view showing a state wherein the probe needle is pierced into the cleaner.

One embodiment of the present invention will be described with reference to FIGS. 1A, 1B and 2. A cleaner 1 according to this embodiment has a cleaner layer 4 and a substrate 5 on which the cleaner layer 4 is placed. The cleaner layer 4 is constituted by an elastic material layer 2 made of an elastic material (rubber), and a surface state improving filler (powdery material) 3 dispersed in the elastic material layer 2. As an application where the cleaner 1 is used, a case will be described wherein the cleaner 1 is used to clean probe needles 17A of a probe unit which inspects IC chips formed on a semiconductor wafer.

As the elastic material of the elastic material layer 2, either inorganic rubber or organic rubber can be used. In particular, inorganic rubber such as silicone rubber can be preferably used. As the filler 3, a material having a function of improving the surface state of the probe needles is selected. An example of the function that improves the surface state of the probe needles includes removal (abrasion) of the attaching substance by scraping, removal of the attaching substance by polishing, burr removal, and surface roughening. In this embodiment, a powdery material having an abrasive function of scraping the substance (an oxide of the electrode material of the IC chip) attaching to the needle point of the probe needle is employed. As an example of this powdery material, one of ceramic materials, e.g., sand, glass, alumina, Carborundum (trade name), and the like, or their mixture can be employed. The particle diameter of the filler 3 is preferably 3 $\mu$m to 15 $\mu$m and more preferably 5 $\mu$m to 10 $\mu$m. If the particle diameter is less than 3 $\mu$m, the scraping function (the function as the abrasive powders) is poor; if it exceeds 15 $\mu$m, the drape between the elastic material layer 2 and filler 3 may suffer and the needle point of the probe needle may then be damaged. The substrate 5 is preferably made of such a material that the elastic material layer 2 is difficult to separate from the substrate 5. For example, when the elastic material is silicone rubber, the substrate 5 is preferably a silicon substrate.

The weight composition (elastic material:filler) of the elastic material layer 2 to the filler 3 of the cleaner layer 4 is preferably 5:5 to 3:7 and more preferably 4:6 to 3:7. If the weight composition is less than 5:5, dispersion of the filler loses its significance; if it exceeds 3:7, the drape between the elastic material layer 2 and the filler 3 may suffer and the needle point of the probe needle may be damaged.

The suitable weight composition of the elastic material to the filler changes depending on the material of the probe needles 17A as well. As the material of the probe needles 17A, palladium or an alloy, e.g., beryllium-copper, can be used other than tungsten. A composition suitable for the material of the probe needles 17A must be appropriately selected. When the material of the probe needles 17A is tungsten, the composition can be 4:6. A thickness t of the cleaner layer 4 placed on the substrate 5 can be any value as far as the substance attaching to the needle point of the probe needle 17A is removed when the probe needle 17A is pierced into the cleaner layer 4, and is not particularly limited. In general, the thickness t of the cleaner layer 4 is preferably 500 $\mu$m to 1.000 $\mu$m.

The cleaner according to the present invention can be manufactured in accordance with various types of methods (processes). An example of a preferable manufacturing process will be described. A crude elastic material layer 2 and a filler 3 are mixed by a known method to prepare a material for a cleaner layer 4. For example, the filler 3 is gradually added to the silicone elastic material to reach a predetermined weight composition. As the catalyst, a predetermined amount (e.g., 1.5% to 4% with respect to the elastic material) of a polymerization initiator (e.g., benzoyl peroxide) is added. The filler 3 is dispersed sufficiently. The mixture is compounded for an aging period required for the filler 3 to have sufficiently good drape with the elastic material layer 2. The resultant compound is applied to the substrate 5. The compound on the substrate 5 is subjected to pressure molding (e.g., 70 kg/cm$^2$) for 10-odd minutes under a predetermined temperature (e.g., about 120° C.). After this pressure molding, the temperature is lowered and the pressurizing operation is stopped. Upon these series of operations, the crude elastic material polymerizes and is set to form silicone rubber. The cleaner layer 4 obtained by dispersing the filler 3 in the silicone rubber as the elastic material layer 2 is placed on the surface of the substrate 5, and is integrated with it. A skin film 2A having a very smooth surface is formed on the surface of the silicone rubber 2. This skin film 2A is slightly sticky and has a function of capturing the attaching substance. A film, like this skin film 2A, which does not contain a material having a surface state improving function, can be formed on the skin film 2A or directly on the elastic material layer 2.

A method of cleaning the probe needles by using the cleaner 1 will be described. The cleaner 1 can be set at any position where it can clean the probe needles. In the embodiment shown in FIG. 5, the cleaner 1 is attached to, e.g., a mount table 15A of a main chuck 15. The probe needles 17A are repeatedly brought into contact with the aluminum electrode pads for the purpose of inspection. As the contact frequency increases, a substance O, e.g., aluminum oxide, attaches to the needle points of the probe needles 17A (see FIG. 1A). This attaching substance O interferes with the probe needles from coming into good electrical contact with the electrode pads. When the probe needles 17A to which the substance O attaches are cleaned in this manner, they can be used again.

Figure 5:
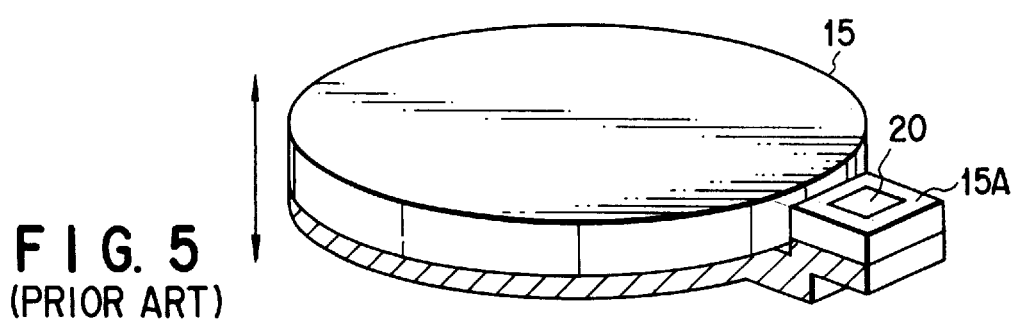
FIG. 5 is an enlarged perspective view of the main chuck of the conventional probe unit.

Referring to FIG. 5, the main chuck 15 is moved so that the mount table 15A is aligned to immediately under the probe needles 17A. Then, the main chuck 15 is moved upward and the probe needles 17A come into contact with the cleaner layer 4 of the cleaner 1 on the mount table 15A (FIG. 1A). When the main chuck 15 is further over-driven by about 100 $\mu$m, the probe needles 17A pierce into the cleaner layer 4 by about 100 $\mu$m (FIG. 1B). When the probe needles 17A pierce into the cleaner layer 4, the dust or the like lightly attaching to the needle points of the probe needles 17A is scraped by the silicone rubber 2 constituting the cleaner layer 4, and attaches to the interiors of the skin film 2A and elastic material layer 2 to be held by them. The attaching substance O, e.g., aluminum oxide, strongly attaching to the needle points enters the cleaner layer 4 as it attaches to the needle points. The needle points of the probe needles 17A are pierced into the cleaner layer 4 while they are in contact with the filler 3 in the silicone rubber 2. The attaching substance O on the needle points is scraped by the silicone rubber 2 and the filler 3. The attaching substance O is scraped by the elastic material layer 2 and the filler 3 also when the main chuck 15 is moved downward and the needle points of the probe needles 17A come out of the cleaner layer 4. The silicone rubber 2 and the film 2A sandwich the scraped attaching substance O between them with their elasticity, and the substance O attaching to the needle points is left in the silicone rubber 2. The attaching substance O removed from the needle points of the probe needles 17A is retained inside the skin film 2A and cleaner layer 4 and substantially does not appear to the outer surface. As a result, the attaching substance O is removed from the probe needles 17A, and the needle points of the probe needles 17A are cleaned.

As described above, in this embodiment, the attaching substance on the needle points of the probe needles 17A is reliably scraped and removed. Since this attaching substance is held in the cleaner layer, it does not scatter in the form of particles.

Figure 2:
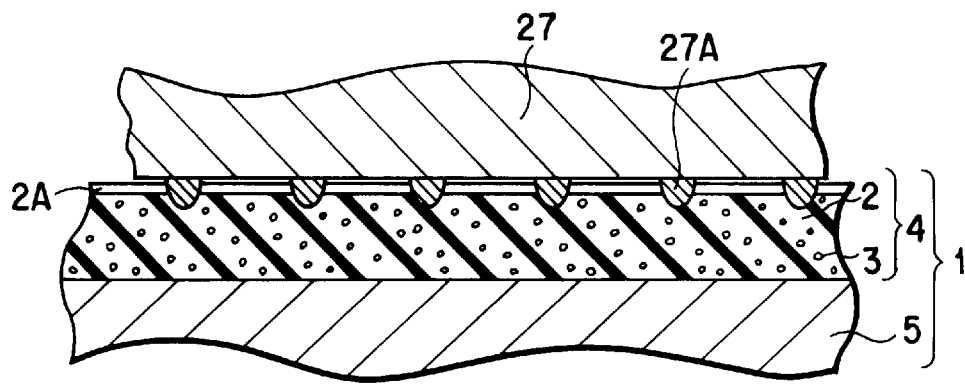
FIG. 2 is a view for explaining how the bump terminals of a membrane card are cleaned.

FIG. 2 shows another embodiment. In this embodiment, bump terminals 27A of a membrane probe card 27 are cleaned. When the membrane probe card 27 is repeatedly used in order to inspect the electrical characteristics of a wafer, aluminum oxide attaches to the bump terminals 27A, in the same manner as in the case of the probe needles. When the membrane probe card 27 is pressed by a cleaner 1, the bump terminals 27A are pierced into a cleaner layer 4 of the cleaner 1. The attaching substance on the surfaces of the bump terminals 27A is reliably removed by the cleaner layer 4.

Figure 6A:
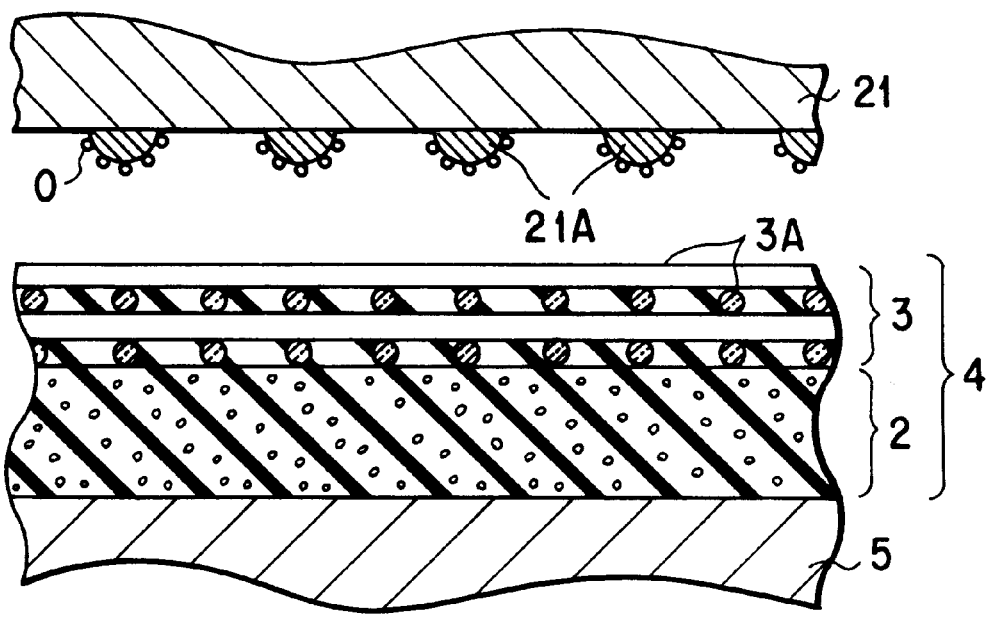
FIG. 6A is a sectional view showing a state immediately before bump terminals each having a substance attaching to it are pierced into a mesh cleaner.
Figure 6B:
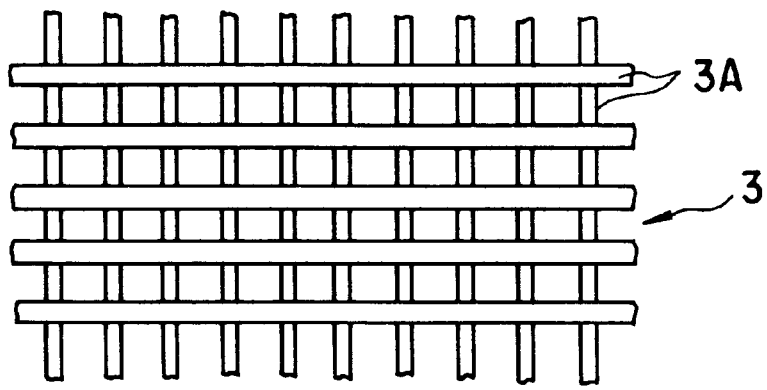
FIG. 6B is an enlarged plan view of the surface of mesh-like fibers obtained by plainly weaving long fibers.
Figure 6C:
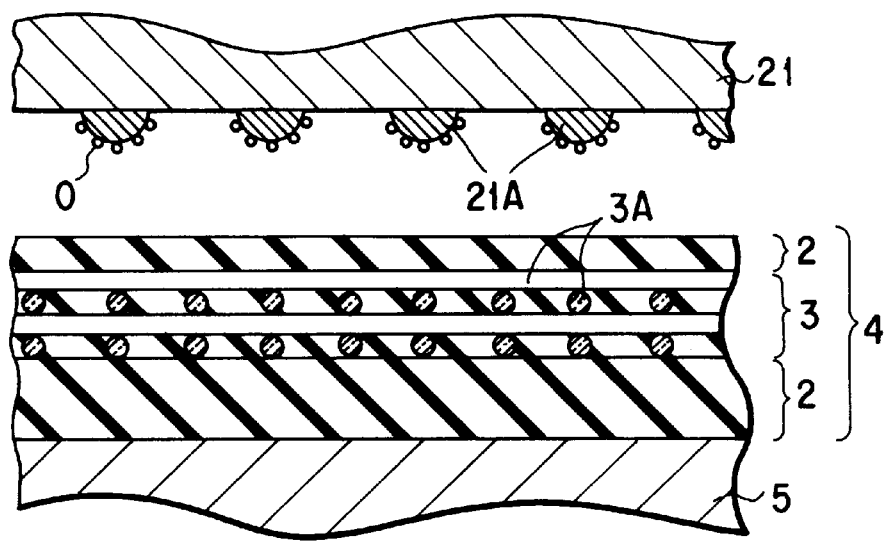
FIG. 6C is a sectional view showing a mesh cleaner in which a fiber layer is integrated in the elastic material.

FIGS. 6A and 6B show still another embodiment of the present invention. In this embodiment, mesh is used as a material having a surface state improving function. A mesh-like fiber layer (mesh-like inorganic fiber layer) 3 is stacked on an elastic material layer 2 and is integrated with it. The mesh-like inorganic fiber layer 3 can be integrated in the elastic material layer 2 in a sandwich-like manner (FIG. 6C). FIGS. 6A and 6B show a structure in which the mesh-like fiber layer 3 is stacked on the elastic material layer 2. A cleaner layer 4 constituted by the elastic material layer 2 and the mesh-like fiber layer 3 is placed on a substrate 5. This cleaner will be referred to as a mesh cleaner hereinafter. A case will be described wherein the bump terminals of the membrane probe card are cleaned by using the mesh cleaner 1.

As the elastic material, either inorganic rubber or organic rubber can be used. Inorganic rubber such as silicone rubber is particularly preferable. As the mesh-like fiber layer 3 to be integrated with the elastic material layer 2, an inorganic fiber, an organic fiber, a carbon fiber, or the like can be used. These fibers can be used in the form of either a long fiber or a short fiber. Above all, a structure obtained by plainly weaving an inorganic long fiber, e.g., a glass fiber, is preferable. Glass fibers 3A need not be regularly weaved, unlike in FIG. 6B. It suffices as far as the bump terminals or probe needles pierce into the fibers and come out of the fibers while the surfaces of the terminals or needles are in contact with the fibers.

FIG. 6B shows a structure obtained by plainly weaving the glass long fibers 3A. As the mesh-like fiber layer 3, one obtained by stacking a plurality of mesh-like fibers is preferable. The mesh-like fiber layer 3 is preferably integrated with the elastic material layer 2 so that it does not separate from the elastic material layer 2.

Figure 6D:
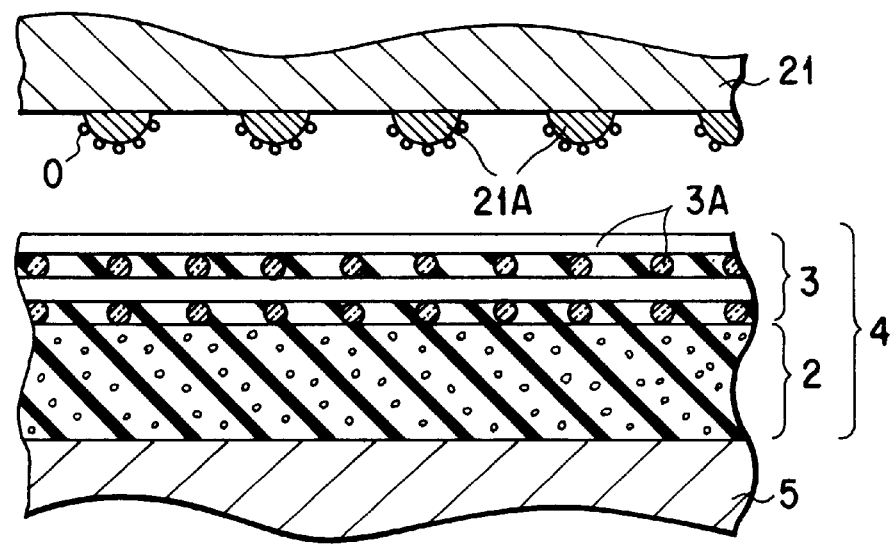
FIG. 6D is a sectional view showing a mesh cleaner in which a fiber layer is integrated on an elastic material layer dispersed with a powdery filler.

As the substrate 5, one having good affinity with the elastic material layer 2 so that the elastic material layer 2 does not easily separate from it is preferable. For example, if the elastic material layer 2 is made of silicone rubber, a silicon substrate is preferable. As the substrate 5, one the surface of which is roughened to improve the adhesion properties with the elastic material can be used. The elastic material layer 2 can be dispersed with the powdery filler (described above) having a surface state improving function (FIG. 6D). The particle diameter of the powder used as the filler is preferably 3 $\mu$m to 15 $\mu$m and more preferably 5 $\mu$m to 10 $\mu$m.

When dispersing a filler in the elastic material of the elastic material layer 2, the weight composition (elastic material:filler) of the elastic material to the filler is preferably 5:5 to 3:7 and more preferably 4:6 to 3:7.

Figure 4:
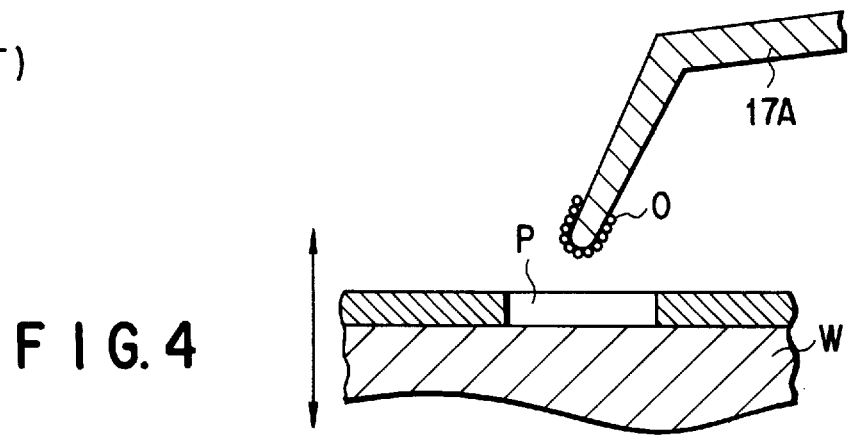
FIG. 4 is an enlarged sectional view showing a state wherein aluminum oxide or the like attaches to the needle point of a probe needle.

The thickness of the cleaner layer 4 is not particularly limited as far as the probe needles 17A can be pierced into the cleaner layer 4 so that the substance attaching to the needle points of the probe needles 17A is removed. In general, 500 $\mu$m to 1,000 $\mu$m is preferable. The bump terminals of the membrane probe card are manufactured by coating an ore, e.g., diamond or sapphire, with gold, a gold alloy, or the like. In the case of the probe needles 17A shown in FIG. 4, as the material of the probe needles 17A, palladium or beryllium-copper can be used other than tungsten.

The process of fabricating the mesh cleaner 1 will be described. As the catalyst, a predetermined amount (e.g., 1.5% to 4% with respect to the crude elastic material) of a polymerization initiator (e.g., benzoyl peroxide) is added to the crude elastic material of an elastic material layer 2. When dispersing the filler in the elastic material layer 2, prior to addition of the polymerization initiator, the filler is gradually added to the crude elastic material until a predetermined composition is obtained, and the crude elastic material and the filler are mixed by a known method. After the polymerization initiator is added, the mixture is aged for a predetermined period required for the filler to have sufficiently good drape with the elastic material layer 2, to form a compound. This compound is applied to a silicon substrate 5, and a mesh-like inorganic fiber layer 3 obtained by stacking two mesh-like glass fibers 3A is placed on the compound. In this state, the compound on the substrate 5 is subjected to pressure molding by applying a predetermined pressure (e.g., 70 kg/cm$^2$) to it for 10-odd minutes under a predetermined temperature (e.g., about 120° C.). After that, the temperature is lowered and the pressurizing operation is stopped. Upon these series of operations, the crude elastic material of the compound polymerizes and is set to form silicone rubber. The cleaner layer 4 obtained by integrating the elastic material layer 2 and the filler 3 is thus formed on the surface of the substrate 5. The process of integrating the elastic material layer 2 and the mesh-like fiber layer.3 is not limited to the above process, but various types of processes can be employed.

A process of cleaning the bump terminals of the membrane probe card by using the mesh cleaner 1 will be described. The mesh cleaner 1 is attached to the mount table 15A of the main chuck 15 as shown in FIG. 5. In the same manner as in the case of probe needles described above, as bump terminals 21A of a membrane card 21 are repeatedly brought into contact with the electrode pads of the IC chips formed on a wafer for the purpose of inspecting the IC chips, a substance O, e.g., aluminum oxide, attaches to the needle points of the bump terminals. The attaching substance O degrades the electrical contact between the bump terminals and the electrode pads. The distal ends of the bump terminals 21A are cleaned by the cleaning method using the mesh cleaner of this embodiment, and the bump terminals can be used again.

Figure 7:
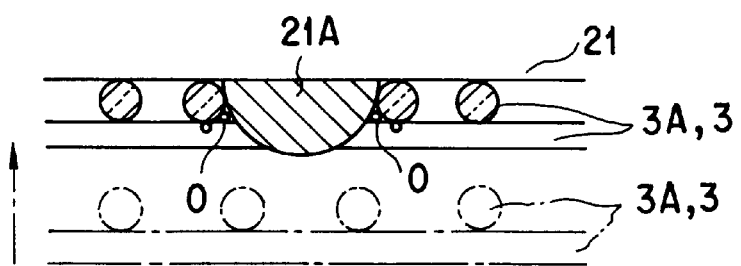
FIG. 7 is a view for explaining how to clean the bump terminals by using a mesh cleaner.

The main chuck 15 (FIG. 5) is moved upward so that the mount table 15A is aligned immediately under the bump terminals 21A. At this position, the main chuck 15 is moved upward, and the bump terminals 21A come into contact with the cleaner layer 4 of the cleaner 1 on the mount table 15A. Furthermore, when the main chuck 15 is over-driven, the bump terminals 21A abut against the mesh-like fiber layer 3 (3A), as shown in FIG. 7, and force into the fibers 3A until they pierce the elastic material layer 2. When the bump terminals 21A pass through the mesh-like fiber layer 3, dust or the like lightly attaching to the bump terminals 21A is scraped by the silicone rubber of the elastic material layer 2.

The attaching substance O, e.g., aluminum oxide, strongly attaches to the bump terminals 21A. When the bump terminals 21A pass through the mesh-like fiber layer 3, the attaching substance O is scraped by the glass fibers 3A. Thereafter, when the main chuck 15 is moved downward and the bump terminals 21A come out of the mesh-like fiber layer 3, the scraped attaching substance O remains in the elastic material layer 2 and mesh-like fiber layer 3. As a consequence, the bump terminals 21A are efficiently cleaned.

According to this embodiment, the attaching substance, e.g., dust, lightly attaching to the bump terminals 21A is scraped by the elastic material layer 2, and the attaching substance O, e.g., aluminum oxide, strongly attaching to the bump terminals 21A is reliably scraped by the mesh-like fiber layer 3. The attaching substance O which is scraped by the bump terminals 21A when the bump terminals 21A come out of the cleaner layer 4 is captured by the elastic material layer 2 and mesh-like fiber layer 3, and will not scatter to the outside. Therefore, the IC chips will not be contaminated.

Figure 3:
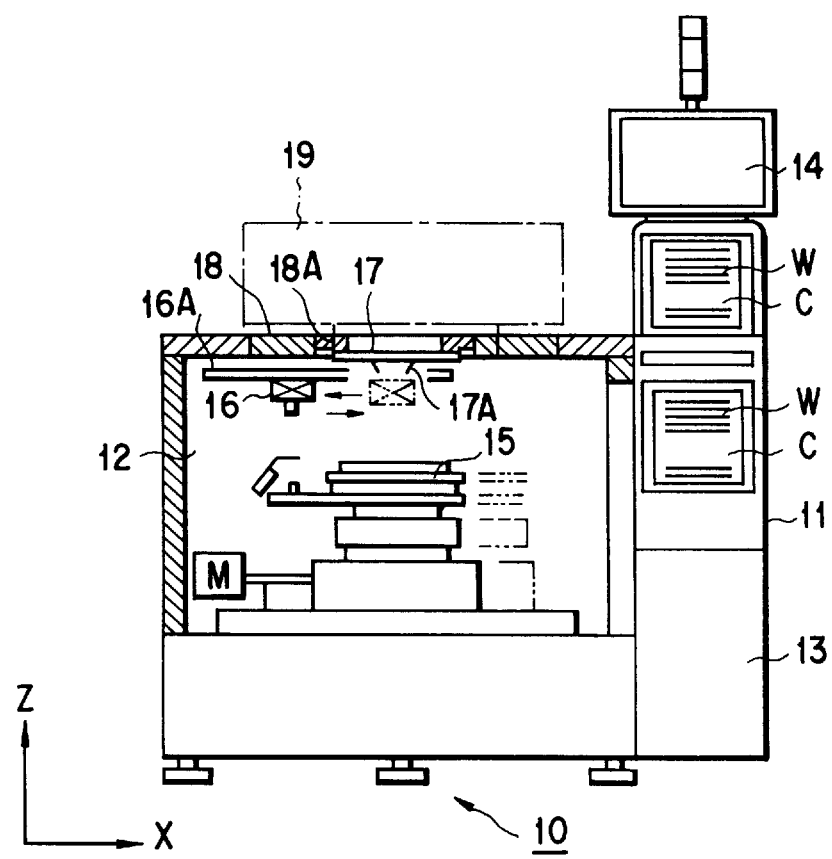
FIG. 3 is a front view showing the main part of a conventional probe unit.

In this embodiment, a case is described wherein the bump terminals 21A of the membrane card 21 are cleaned. The mesh cleaner 1 can be used also for removing the attaching substance O of the probe needles 17A of the probe card 17 shown in FIG. 3.

The cleaner according to the present invention can be used also in the probe needle manufacturing process.

For example, in a probe card manufacturing process, the cleaner according to the present invention can be used for removing the burr at the distal end of a probe needle, which is formed when manufacturing the probe needle from a wire. Although burr removal at the distal ends of the probe needles 17A is currently performed by wet etching, if the cleaner of the present invention is used, burr removal can be performed very easily.

The cleaner according to the present invention can also be used for cleaning a solder bump formed on a flip-chip element. After the solder bump is cleaned, face down bonding is performed, so that the flip-chip element can be reliably bonded on the substrate without adversely affecting its electrical characteristics.

The present invention is not limited to the above embodiments but can also be applied to a measurement needle that inspects a mounted electronic component.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A cleaner for inspecting projections, comprising:
   a substrate; and
   a cleaner layer fixed on said substrate, said cleaner layer having an elastic material layer and a material having a surface state improving function for the inspecting projections and integrated with said elastic material layer,
   wherein said projections are pierced into and pulled out of said cleaner layer to improve a surface state thereof.

2. The cleaner according to claim 1, wherein a filler of the material having a surface state improving function is added to said elastic material in said cleaner layer with a weight composition of said elastic material to said filler of 4:6 to 3:7.

3. The cleaner according to claim 1, wherein a film not containing the material having the surface state improving function is formed on a surface of said cleaner layer.

4. The cleaner according to claim 1, wherein said material having the surface state improving function is a powder.

5. The cleaner according to claim 1, wherein said material having the surface state improving function is a fiber.

6. The cleaner according to claim 1, wherein said material having the surface state improving function is an inorganic fiber.

7. The cleaner according to claim 1, wherein said material having the surface state improving function is an inorganic fiber and a powder.

8. A cleaner for inspecting projections, comprising:
   a substrate; and
   a cleaner layer fixed on said substrate, said cleaner layer having an elastic material layer and a filler dispersed in said elastic material layer,
   wherein said inspecting projections are pierced into said cleaner layer to remove a substance attaching to distal ends of said projections.

9. The cleaner according to claim 8, wherein said filler is added to said elastic material in said cleaner layer with a weight composition of said elastic material to said filler of 4:6 to 3:7.

10. A cleaner for inspecting projections, comprising:
    a substrate; and
    a cleaner layer fixed on said substrate, said cleaner layer having an elastic material layer and a mesh-like inorganic fiber layer integrally stacked on said elastic material layer,
    wherein said inspecting projections are pierced into said cleaner layer to remove a substance attaching to distal ends of said projections.

11. An inspection apparatus which has inspecting projections that are brought into contact with electrodes of at least one integrated circuit formed on a semiconductor wafer, and which inspects electrical characteristics of the integrated circuit, said inspection apparatus comprising
    a cleaner for cleaning said projections, said cleaner comprising:
       a substrate; and
       a cleaner layer fixed on said substrate, said cleaner layer having an elastic material layer and a material having a surface state improving function for the inspecting projections and integrated with said elastic material layer,
    wherein said inspecting projections are pierced into said cleaner layer to improve a surface state of said inspecting projections.

12. The inspection apparatus according to claim 11, wherein a filler of the material having the surface state improving function is added to said elastic material in said cleaner layer with a weight composition of said elastic material to said filler of 4:6 to 3:7.

13. The apparatus according to claim 11, wherein a film not containing the material having the surface state improving function is formed on a surface of said cleaner layer of said cleaner.

14. The apparatus according to claim 11, wherein said material in said cleaner which has the surface state improving function is a powder.

15. The apparatus according to claim 11, wherein said material in said cleaner which has the surface state improving function is a fibrous material.

16. The apparatus according to claim 11, wherein said material in said cleaner which has the surface state improving function is an inorganic fiber.

17. The apparatus according to claim 11, wherein said material in said cleaner which has the surface state improving function is an inorganic fiber and a powder.

18. An inspection apparatus which has inspecting projections that are brought into contact with electrodes of at least one integrated circuit formed on a semiconductor wafer, and which inspects electrical characteristics of the integrated circuit, said inspection apparatus comprising a cleaner for cleaning said inspecting projections, said cleaner comprising:
a substrate; and
a cleaner layer fixed on said substrate, said cleaner layer having an elastic material layer and a filler dispersed in said elastic material layer, and said cleaner serving to clean said inspecting projections, wherein said inspecting projections are pierced into said cleaner layer to remove a substance attaching to projecting ends of said projections.

19. An inspection apparatus which has inspecting projections that are brought into contact with electrodes of at least one integrated circuit formed on a semiconductor wafer, and which inspects electrical characteristics of the integrated circuit, said inspection apparatus comprising a cleaner for cleaning said inspecting projections, said cleaner comprising:
a substrate; and
a cleaner layer fixed on said substrate, said cleaner layer having an elastic material layer and a mesh-like inorganic fiber layer integrally stacked on said elastic material layer, and said cleaner serving to clean said inspecting projections, wherein said projections are pierced into said cleaner layer to remove a substance attaching to projecting points of said projections.

20. A method of inspecting electrical characteristics of integrated circuits formed on a semiconductor wafer, comprising the steps of bringing inspecting projections into contact with electrodes of the integrated circuits, and measuring the electrical characteristics of the integrated circuits, the method further comprising the step of cleaning said inspecting projections with a cleaner, said cleaner comprising:
a substrate; and
a cleaner layer fixed on said substrate, said cleaner layer having an elastic material layer and a material integrated with said elastic material layer and having a surface state improving function for the inspecting projections, and said cleaner serving to clean said inspecting projections, wherein said projections are pierced into and pulled out of said cleaner layer to improve a surface state of said projections.

* * * * *